United States Patent [19]
Larkin

[11] 3,975,633
[45] Aug. 17, 1976

[54] ANALOG TO DIGITAL ENCODER UNIT EMPLOYING A PRE-ENCODED FILM

[75] Inventor: Kenneth A. Larkin, Modesto, Calif.

[73] Assignee: E. & J. Gallo Winery, Modesto, Calif.

[22] Filed: July 11, 1975

[21] Appl. No.: 595,185

[52] U.S. Cl. .......................... 250/237 R; 33/126.6; 250/231 R; 250/570; 250/227; 340/347 AD
[51] Int. Cl.² .......................................... H01J 3/14
[58] Field of Search .......... 33/125 A, 125 C, 126.6; 340/347 P, 347 AD; 250/231 R, 237 R, 237 G, 570, 227, 571; 356/169, 170; 73/321

[56] References Cited
UNITED STATES PATENTS

| | | | |
|---|---|---|---|
| 3,034,217 | 5/1962 | Mayes et al. | 33/126.6 |
| 3,558,861 | 5/1968 | Collins et al. | 250/571 |
| 3,658,429 | 4/1972 | Zipin | 250/237 G |
| 3,685,358 | 8/1972 | Hubner et al. | 33/126.6 |

*Primary Examiner*—David C. Nelms
*Attorney, Agent, or Firm*—Townsend and Townsend

[57] ABSTRACT

An optical encoder unit for generating digital electrical signals defining the absolute level of a liquid in a tank from the translational position of a perforated tape in a conventional liquid level gauge and providing both local and remote readout. A pre-encoded film strip has a plurality of laterally spaced longitudinally extending tracks with transparent and opaque regions encoded in Gray code format, is received on a pair of freely rotatable spools, and is guided past an optical detection station by a pair of spaced stationary guide members. A rotatable sprocket having an input shaft adapted to be driven by a shaft coupled to a sprocket in a conventional perforated tape liquid level gauge drives the film strip past the detection station in response to movement of the tape. A spring biased pivotally mounted tension arm having a guide in surface contact with the film strip maintains tension therein as the film strip is moved from reel to reel. The spools are mechanically interlinked with a drive belt to provide film take-up either direction.

The optical detection station includes a light source assembly for generating a plurality of laterally spaced light beams and a detector assembly having a corresponding plurality of photosensitive devices each associated to a different one of the light beams and shielded from the remaining beams. The film strip is positioned so that each track occupies the light path between a different one of the beams and photosensitive devices to define a plurality of information channels.

20 Claims, 7 Drawing Figures

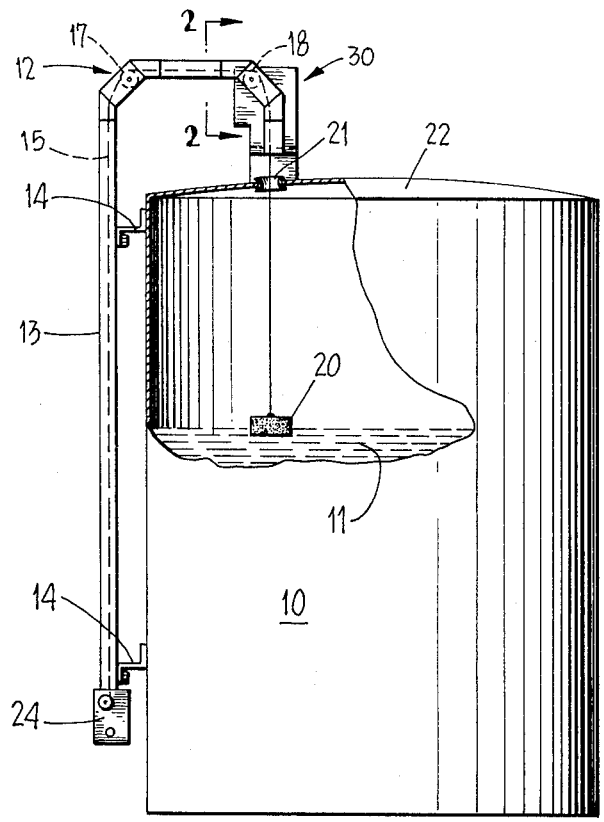
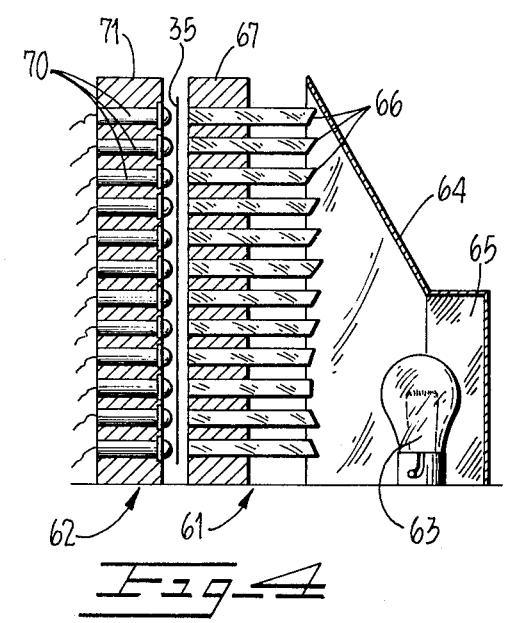
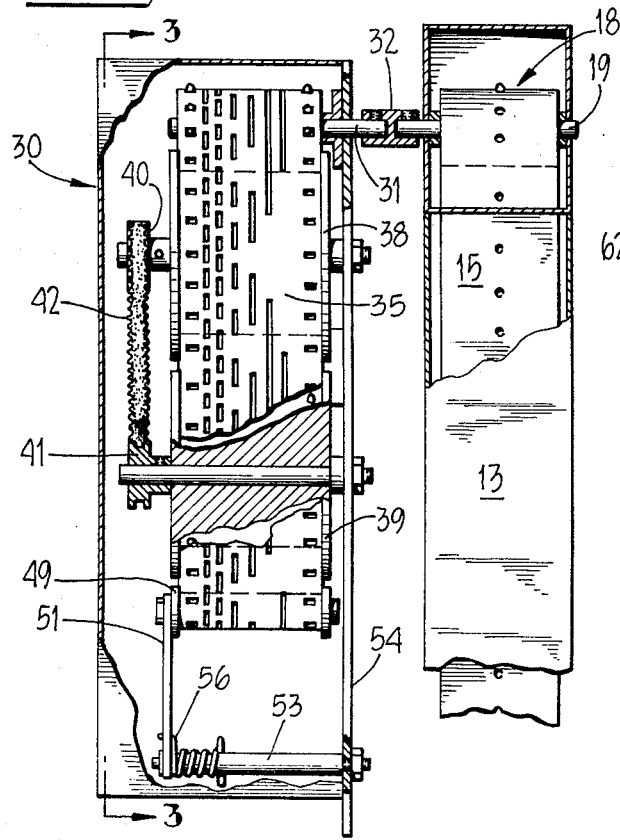
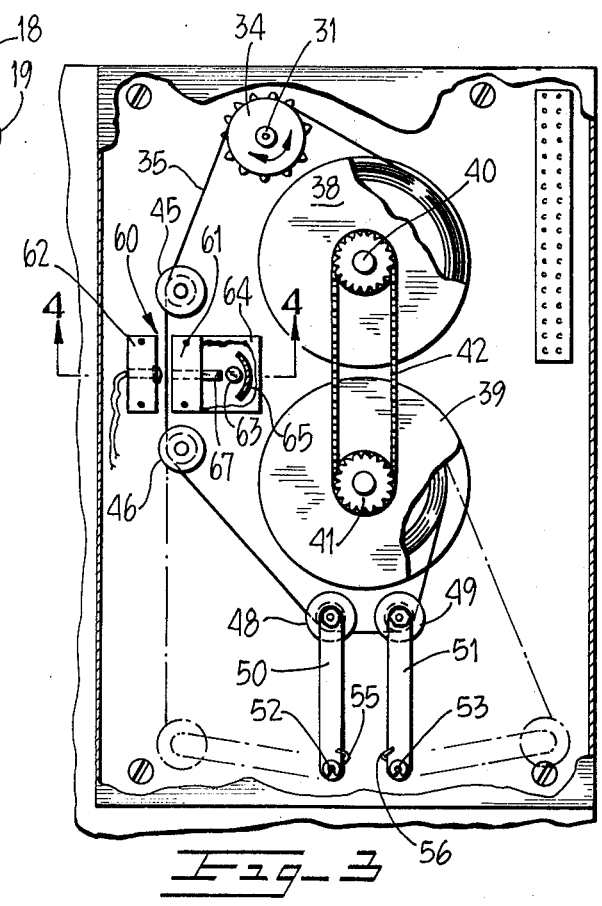

ANALOG TO DIGITAL ENCODER UNIT EMPLOYING A PRE-ENCODED FILM

BACKGROUND OF THE INVENTION

This invention relates to encoders for converting translational or rotational mechanical movement into electronic position signals. More particularly, this invention relates to analog-to-digital encoders for converting the physical position of a liquid level measuring instrument into digitally encoded electronic position signals.

Devices are known for measuring the level of a liquid confined in a reservoir, e.g. water contained by a dam, petroleum liquid in a storage tank, and wine contained in a vat. At present, there are two popular types of commercially available tank gauge systems used for this purpose, both of which employ a hollow conduit enclosing a perforated flexible tape translatably mounted in communication with the interior of the tank through the top at one end. The end of the tape interior to the tank is provided with 2 float member which follows the level of the liquid in the tank. The other end of the tape is attached to a spring motor or negator spring which maintains the tape taut so that motion of the float member is converted to translational motion of the tape and rotational motion of the sprockets or pulleys. In one of the commercially available devices, the tape is physically marked with a graduated scale and a window is provided in the conduit at eye level with a hairline or other sight level to enable readings to be taken. In the other commercially available unit, a reversible rotary mechanical counter having numbered indicator wheels is driven by one of the sprocket wheels and is mounted in a visibly accessible location.

In installations where there is poor lighting, e.g. in wine vats stored in a warehouse, or when it becomes necessary to take night time readings, it is typically difficult to obtain accurate readings with either type of gauge. A more serious limitation however, attendant with the use of commercially available gauges is the requirement that each reading must be obtained at a particular tank site which requires the presence of a human operator at that site. Thus, to obtain level measurements from a plurality of scattered petroleum storage tanks, one or more workmen must be dispatched to the individual tank sites. Similarly, when transferring stored liquids from one tank to another or among several tanks, individual workmen must be stationed at each tank site and a communication link must be provided among all workmen to enable the liquid flow to be monitored.

Other liquid level measuring devices are known which attempt to provide an automated indication of liquid levels, either in the form of an illuminated digital display, a permanent printed chart, a perforated card or the like, and some of which provide a local readout at the tank site, a central readout at a remote location or both. The following U.S. Pats. are believed to be representative of devices of this type: Nos. 2,112,371, 2,132,213, 2,192,421, 3,034,217, and 3,078,715. Such devices typically employ the conduit, tape and float mechanism generally described above, and in addition a variable resistance element, rotating drums with commutator segments and wiper brushes, or other elements which follow the motion of the tape and float and convert this motion to analog or digital electrical position signals. In the '217 patent noted above, a coded photographic film is translated past an optical encoder station in response to the movement of the perforated measuring tape to provide bilevel signals which are coupled to appropriate electromechanical circuitry for providing modified electrical signals indicative of the liquid level.

Encoder devices of which the above patents are representative suffer from several disadvantages. Both the analog and digital devices require costly, relatively sophisticated electromechanical subassemblies which are not readily compatible with existing tank liquid level gauges of the conduit and perforated tape variety, and thus necessitate expensive redesign to existing installations in order to be useful. The digital variety requires initial manual sequencing in order to obtain subsequent accurate readings and must be resequenced in the event of a temporary power failure. In installations having a plurality of devices of the latter type, each device must be manually reset, which renders their implementation even more undesirable. Further, those devices using a rotating drum with commutator segments and cooperating brushes must be periodically serviced by replacing the brushes and eventually the commutator segments due to mechanical wear and the collection of non-electrically conductive contaminants on the brush and commutator surfaces. To date, efforts to provide an absolute encoder for use with existing liquid level measuring gauges or similar devices, and free of the above disadvantages, have not been successful.

SUMMARY OF THE INVENTION

The invention comprises a multi-turn absolute encoder for providing error free digitally encoded electrical signals specifying the absolute position of a translational or rotational member which is low in cost, simple in construction and rugged and reliable in operation.

In the preferred embodiment, especially adapted for use with existing liquid level measuring devices, a preencoded film strip is received about a pair of film reels rotatably mounted on a support member and guided past a detection station by means of guide means secured to the support member and means for maintaining the film in a tensioned state in the region of the detection station. The film is driven by a drive sprocket rotatably mounted on the support member and having an input shaft adapted to be driven by a shaft coupled to one of the sprockets or pulleys of a perforated tape liquid level gauge so that the film follows the motion of the perforated tape. The film is encoded with a plurality of laterally spaced longitudinally extending tracks, each track having transparent and opaque portions arranged in a Gray code format, and the detection station includes means for generating a plurality of radiation beams corresponding in number to the number of tracks on the film and a corresponding plurality of radiation sensing devices each associated to a different track for generating bilevel electrical signals representative of the instantaneous position of the film relative to the detection station.

The guide means preferably comprise a pair of stationary guide members spaced along the film path on either side of the detection station, while the film tensioning means preferably comprises an arm pivotally secured at one end to the support member, a guide member secured to the free end of the arm and in surface contact with the film surface, and biasing means for urging the arm in a direction in which the film is maintained tensioned.

The radiation sensor output signals are coupled to electronic circuitry implementable in solid state form for providing either a local or remote visible readout of the position information. In a local readout embodiment, the electronic circuitry includes an array of amplifiers, a Gray code to binary code decoder, a binary code to BDC code decoder, a plurality of display drivers and a plurality of seven segment optical character generators. In the remote embodiment, the amplified signals from a sub-plurality of encoder sites are coupled to a central data acquisition station and other remote manual date address points by means of a multiplexer unit which provides parallel to serial conversion of the information.

For a fuller understanding of the nature and advantages of the invention, reference should be had to the ensuing detailed description taken in conjunction with the accompanying drawings.

BRIEF DESCRIPTION OF THE DRAWINGS

FIG. 1 is a schematic view partially in section illustrating a tank installation embodying the invention;

FIG. 3 is a partial sectional view taken along lines 3—3 of FIG. 2;

FIG. 4 is a sectional view taken along lines 4—4 of FIG. 3 illustrating an optical detector assembly;

FIG. 7 is a block diagram of a data acquisition system.

DESCRIPTION OF THE PREFERRED EMBODIMENT

Figure 2:
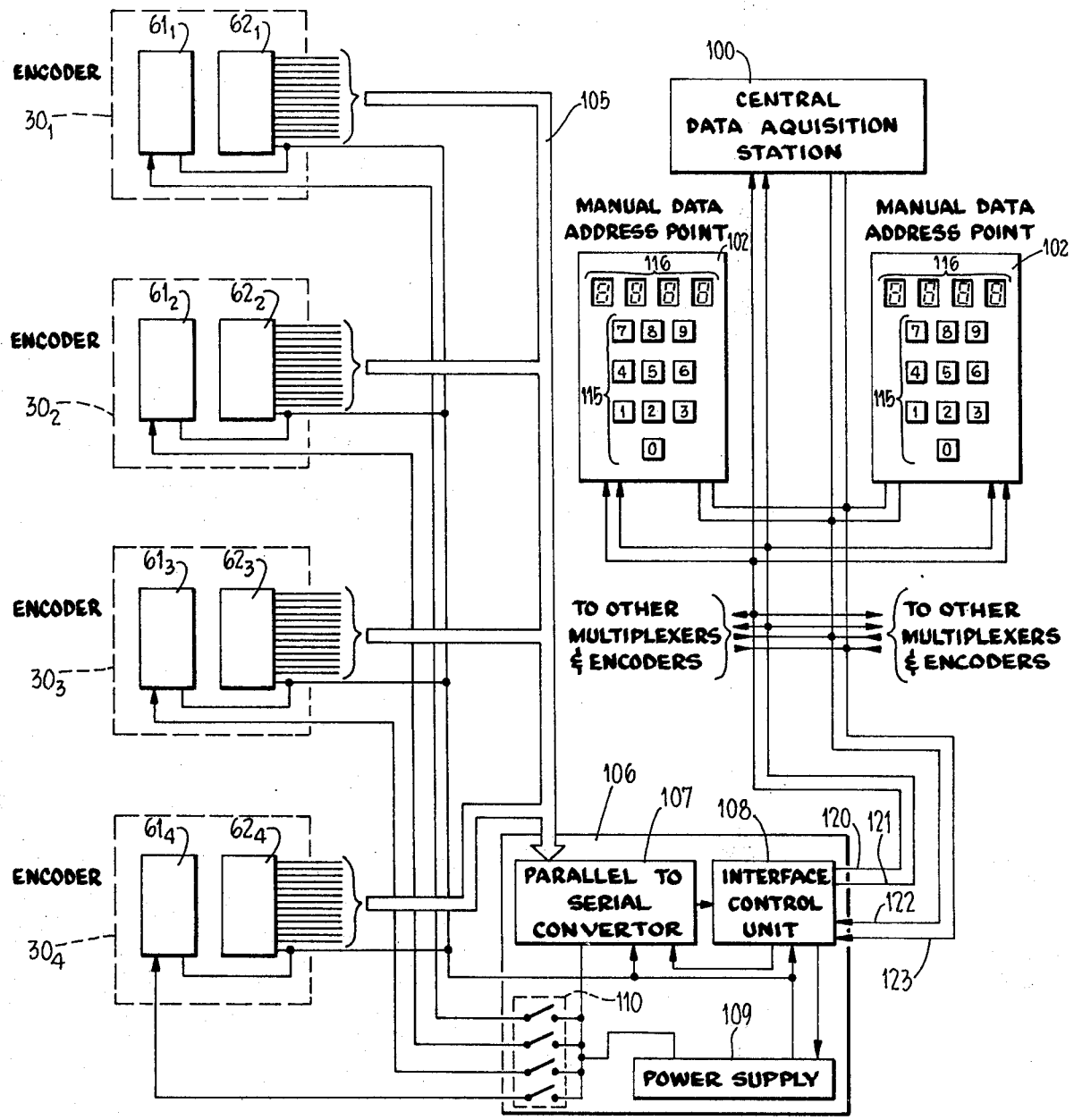
FIG. 2 is a partial sectional view of the invention taken along lines 2—2 of FIG. 1.

Turning now to the drawings, FIG. 1 is a schematic end elevational view, partically in section, showing a tank installation employing the invention. As seen in this Fig., a tank 10 containing a liquid 11 is provided with a liquid level measuring apparatus generally designated by reference numeral 12. Liquid level measuring apparatus 12 is a conventional unit and includes a tubular or rectangular hollow conduit 13 secured to the tank side wall and top by means of conventional brackets 14 and enclosing a perforated tape 15 translatably carried by a pair of freely rotatable sprockets 17, 18 mounted in the upper portion thereof. As best shown in FIG. 2, tape 15 has a plurality of perforations arranged centrally thereof and extending longitudinally therealong, with a nominal center-to-center spacing of one inch. Attached to the free end of perforated tape 15 is a conventional float 20 which rests on the surface of liquid 11 and rises and falls therewith. The perforated tape 15 passes upwardly through an opening 21 in the top wall 22 of tank 10, over pulleys 18, 17 and downwardly to a conventional spring motor or negator spring assembly 24 arranged at the lower end of conduit 13 for maintaining tension on the tape 15.

In use, as the level of the liquid 11 in tank 10 changes, float 20 follows this motion and tape 15 is translated in either direction along conduit 13, depending on whether the level of the liquid 11 is rising or falling. As tape 15 is translated along conduit 13, sprocket 18 is rotated in a first direction for a rising liquid level and in the opposite direction for a falling liquid level.

Secured to conduit 13 and tank 10 adjacent sprocket 18 by means of conventional mounting brackets is an encoder unit generally designated by reference numeral 30 and constructed according to the invention. As best shown in FIGS. 2–4, encoder unit 30 has an input shaft 31 coupled to shaft 19 of sprocket 18 by means of a universal coupling member 32, to the inner end of which is secured a sprocket 34, so that rotation of sprocket 18 by perforated tape 15 is transmitted to sprocket 34. Sprocket 34 controls the translation of a pre-encoded film strip 35, described more fully below, which is wound about a pair of freely rotatable spools 38, 39. Each spool is provided with a toothed wheel or gear 40, 41 and these elements are linked by a suitable driving belt 42, which may comprise any one of a number of known driving belts, e.g. a timing belt, a chain or the like. Preferably, spools 38, 39, gears 40, 41 and belt 42 are all fabricated from plastic in order to provide low weight and low cost.

As shown most clearly in FIG. 3, film strip 35 is passed over a pair of conventional stationary guides 45, 46 and also over a pair of guides 48, 49 each attached to a different one of a pair of pivotable arms 50, 51. Arms 50, 51 are pivotally secured to stationary posts 52, 53 mounted on side wall 54 of encoder 30 and are each provided with a torsion spring 55, 56 serving to bias arms 50, 51 to the phantom positions illustrated in FIG. 3. As will be appreciated by those skilled in the art, biased arms 50, 51 and guides 48, 49 serve to maintain proper tension on film 35 in the region between guides 45 and 46 as film 35 is passed between spools 38, 39 under the action of sprocket 34. This is necessitated by the direct drive provided by sprocket 34 to film 35, the direct drive provided by belt 42 between freely rotatable spools 38, 39 and the varying radius between the center of each spool and the outermost layer of film as film 35 is passed therebetween. In the preferred embodiment, a pair of arms 50, 51 are employed due to the large length (substantially fifty feet) of the coded portion of film 35 employed in the encoder unit 30. It is noted that the length of the coded portion of film 35 is a function of the linear excursion interval to be measured, the diameter of sprocket 18 and, the diameter of film sprocket 34; thus, for a tank with a vertical liquid level excursion interval of 50 feet, a sprocket 18 having a circumference of one foot requires 50 full revolutions to cover the entire interval. If the film sprocket 34 has a corresponding circumference, the required length of the coded portion of film 35 is likewise 50 feet. In the preferred embodiment, however, sprocket 34 is a commercially available unit having a circumference of 2.992 inches. Accordingly, the length of the encoded portion of film 35 required is 149.6 inches. In addition, film 35 includes two additional 1 foot long leader strips for reel mounting purposes. For those applications permitting substantially smaller lengths of film, only one guide 48 and arm 50 may be employed if desired.

A radiation detection station generally designated by reference numeral 60 and comprising a light source assembly 61 and an optical detector assembly 62 is secured to wall 54 in the region between stationary guides 45, 46. Preferably, light source assembly 61 comprises a single lamp 63, a reflective housing 64 having a curved reflector surface 65 and a plurality of light pipes 66 embedded in staggered bores in an opaque block 67. Other equivalent arrangements known to those skilled in the art, such as a single LED source, a plurality of light-emitting diodes equal in number to light pipes 66, or the like may be substituted for lamp 63, as desired. Similarly, an optical wedge may be employed to conduct the light radiation from lamp 63 to light pipes 66, if desired.

Disposed on the opposite side of film 35 from light source assembly 61 is detector assembly 62, which preferably comprises a plurality of photo-sensitive elements 70 received in bores in an opaque block 71 and aligned with light pipes 66 to define a plurality of channels or tracks for generating electrical signals in the manner described below. If desired, other arrangements may be employed for detector assembly 62, e.g. a plurality of photo-sensitive elements in each one of th bores in block 71, or other equivalent configurations known to those skilled in the art. Further, monochromatic light or radiation of a wavelength outside the visible spectrum may be employed, as desired.

Figure 5:
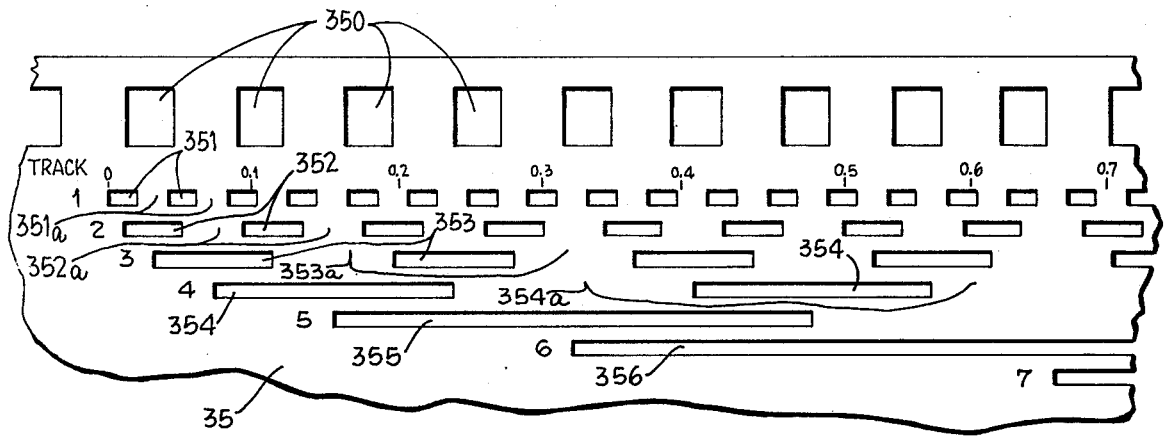
FIG. 5 is a partial plan view illustrating a portion of the encoded film.

With reference to FIG. 5, film 35 is provided with conventional film sprocket holes 350 and has a plurality of pre-exposed tracks for providing digitally encoded multi-bit indicia serving to define the relative position of film 35 with respect to detection station 60 to a desired degree of accuracy. Each track has a series of regularly spaced alternating transparent and opaque rectangular regions. Thus, in track 1, transparent rectangular regions 351 are separated by alternate opaque regions 351a of similar length; in track 2, transparent regions 352 are each separated by alternate opaque regions 352a of similar length: in track 3, transparent regions 353 are separated by alternate opaque regions 353a of similar length, etc. Each track is arranged to occupy the light path between a given associated light pipe 66 and detector 70 when film 35 is in place so that the position of film 35 at any given instant may be ascertained to a prescribed lower limit of accuracy by the unique combination of electrical signal outputs of detectors 70.

In the preferred embodiment designed for use with level measuring tape 15 having a 50 feet vertical excursion limit, 13 tracks are employed each having a width of 0.025 inch and a between-track separation of 0.035 inch, which provides a lower limit of accuracy of 1/100th foot. The tracks are preferably encoded in a Gray code format with lineal distances along film 35 graduated in English units. If desired, however, film 35 may be pre-encoded in metric units for applications requiring incremental measurements in the metric system. Further, film 35 may be encoded to incorporate the "strapping corrections" for a particular tank 10.

In use, as perforated tape 15 is translated along conduit 13, by variations in the level of liquid 11 in tank 10, sprocket 34 is rotated in a corresponding sense causing film 35 to be translated past the detection station 60. As the relative position of film 35 changes, the encoded tracks vary the light falling on the individual detectors 70, thereby causing the electrical output signals to change. These signals are then decoded in the manner noted below, in order to provide liquid level information signals.

Figure 6:
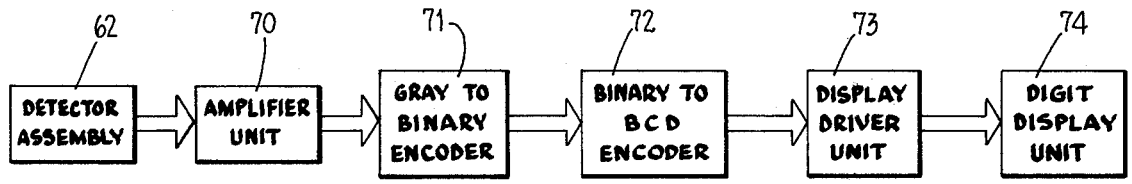
FIG. 6 is a block diagram of a local decoder-display unit.

FIG. 6 is a block diagram of a system for converting the electrical position signals from detector assembly 62 to a visible display of the level of liquid in tank 10. The individual outputs of detector assembly 62, i.e. the signal outputs from the individual photodetectors 70 are coupled to an amplifier unit 70 comprising an array of individual amplifiers in which the individual detector signals are amplified to appropriate driving levels and shaped, if required, before being input to a Gray-to-binary decoder 71. Decoder 71 is a conventional unit for converting digital signals encoded in a Gray code format to digital signals encoded in a natural or pure binary format. Decoder 71, for example, may comprise a pair of Digital Equipment Company type M 1125 decoders or a Control Logic, Inc. type CXO-477 decoder. The output of decoder 71 is coupled to a binary to BCD decoder 72 wherein the pure binary signals are converted to binary coded decimal signals. Decoder 72 preferably comprises two Digital Equipment Corporation type M 230 units, or three Control Logic, Inc. type CDB-451 units. The output of decoder 72 is coupled to the input of a conventional display driver unit, such as a Texas Instruments type SN. 7448 N or equivalent. the output of display driver unit 73 is used to drive a conventional multi-digit 7-segment digital display 74. In the preferred embodiment, a four digit display is employed (since the maximum vertical range is 50 feet and the lower limit of accuracy is 0.01 foot), and display driver unit 73 comprises 4 individual 7-segment display drivers each coupled to a different one of the digits in display unit 74.

The embodiment of FIG. 6 is ideally suited for applications requiring a digit display at a given tank site, and in an application having a plurality of tanks, each system of FIG. 6 would be located at the associated tank 10 site. Since the FIG. 6 system may be implemented with conventional solid state electronics, the entire system may be enclosed within the housing of encoder 30 with the digits display unit 74 mounted in such a manner as to be viewable by a human operator. Alternatively, the outputs of each individual amplifier unit 70, decoder 71, or decoder 72 of a plurality of encoder units 30 may be coupled in parallel to a central site, and a selector switch provided to enable central display of the encoder unit 30 output signals. Various alternative arrangements will occur to those skilled in the art.

FIG. 7 illustrates a more sophisticated system in which the liquid level information signals from a plurality of tanks may be routed to a central data acquisition station 100 and also to one or more manual data address points 102. The 13-bit parallel information signals from a predetermined subplurality of encoder stations $30_1$, $30_2$, ...., are routed via a data bus 105 to an associated multiplexer unit 106 wherein the information is converted from parallel to serial form by a conventional parallel to serial converter 107. The serial digital information is fed via an interface control unit 108 and data lines 120, 121 to central data acquisition station 100 and to the manual data address points 102. Supervisory and control commands are fed to each individual multiplexer unit 106 from central data acquisition station 100 to manual data address points 102 via control lines 122, 123. Multiplexer unit 106 includes a power supply unit 109 for generating DC voltage of the appropriate level for operating the parallel-to-serial converter 107 and interface control unit 108. In addition, electrical power from power supply 109 is applied to the detector arrays $62_i$ directly to maintain these units in the active state, and also via a plurality of switches 110 to the light source assemblies $61_i$. Switches 110 preferably comprise electronic switches, such as gated transistors actuated by appropriate command signals from station 100 or data address points 102, to supply energizing power to specified ones of the light source assemblies 61$_i$ in response to these command signals.

In applications requiring power conductors of excessive length between individual multiplexer units 106 and associated encoders 30, it may be impractical to supply both lamp and detector power from the former to the latter. In such applications, it may be preferable to provide each encoder 30 with a separate local power supply so that the light sources are each continuously energized, and to configure switches 110 in such a manner that the common terminal of each group of parallel input data terminals is energized by a different one of switches 110.

Central data acquisition station 100 comprises a general purpose digital computer capable of acquiring and storing information supplied by the encoder stations 30$_i$. The type of information stored, e.g. sampling rates of the various stations, liquid levels and the like, may be tailored to the requirements of any particular application by one of ordinary skill in the computer programming art.

Each manual data address point 102 contains a keyboard for enabling manual endigiting of supervisory and command signals; a viewable digital display 116, which may be an incandescent display, an LED display or the like; and also appropriate interface circuitry for enabling control signals to be supplied to and received from the various sub-units of the system. As suggested by the Fig., other multiplexer units 106 and encoder stations 30$_i$ associated thereto may be tied into the serial data and control lines to accommodate other tank installations. If desired, of course, each encoder unit 30 may be provided with a parallel-to-serial converter 107 to reduce the total number of conductors extending to the associated multiplexer unit 106.

Liquid level measuring devices constructed in accordance with the teaching of the invention offer several advantages over known systems. The individual encoder units 30 are compact and rugged, inexpensive to manufacture and fully compatible with existing liquid level gauges, so that they may be easily installed with little or no expertise and readily removed for repair. Further, unlike many electrical and electronic liquid level measuring units, encoders 30 provide a non-volatile storage of the liquid level information, so that this information is never lost in the event of a temporary power failure. Moreover, the invention enables absolute encoding of the level information within a range limited only by the length of the film 35 installed in the encoder 30. In addition, the unit may be quickly and conveniently changed from one system of units, e.g. English, to another, e.g. metric, by simply exchanging encoded films 35. Further, the invention may be adapted to provide local read-out at the storage tank site, either continuous or on demand, remote read-out at one or more stations, e.g. a supervisor's office, and used for supervisory purposes, e.g. monitoring the transfer of liquids from one tank to another.

It is further noted, that, although the invention has been specifically described with reference to use with existing liquid level gauges, the contemplated uses for the invention extend beyond liquid level measurement to the measurement of the position of both translatable and rotatable elements. For example, the invention may be employed to convert the translational position of a machine tool or the angular position of the lead screw of a lathe to digitally encoded signals.

While the above provides a full and complete disclosure of the preferred embodiments of the invention, various modifications, alternate constructions and equivalents may be employed without departing from the true spirit and scope of the invention. For example, the number and size of the tracks pre-encoded on film 35 may be varied in accordance with the requirements of a particular application. Similarly, encoder unit 30 need not be mounted alongside sprocket 18, but may be located at substantially any point along the path of perforated tape 15 or, if desired, may be coupled to negator spring assembly 24. Therefore, the above description and illustrations should not be construed as limiting the scope of the invention which is defined by the appended claims.

What is claimed is:

1. An optical encoder unit for generating digital electrical signals defining the absolute position of a movable member from a rotatable shaft coupled to said movable member, said optical encoder unit comprising:
   a support member;
   first and second film reels rotatably secured to said support member;
   motion translating means coupled to said reels for transferring motion therebetween;
   guide means secured to said support member;
   a radiation detection station mounted adjacent said guide means, said station including a radiation source for generating a plurality of spaced radiation beams and a radiation detector assembly having a plurality of radiation sensitive means each associated to a different one of said beams for generating said electrical signals;
   a pre-encoder film strip received by said reels and guided by said guide means past said detection station, said film strip having a plurality of laterally spaced, longitudinally extending coded tracks, each arranged to occupy the radiation path between said source and a different one of said generating means;
   a non-slip film drive means engagable with said film strip and having an input shaft adapted to be coupled to said rotatable shaft; and
   means for maintaining tension in said film strip as said strip is translated past said detection station from reel to reel in response to rotation of said film drive means.

2. The combination of claim 1 wherein said reels are each provided with a toothed member and said motion translating means comprises a flexible belt engaged with said toothed members.

3. The combination of claim 1 wherein said guide means comprises a pair of stationary guide members.

4. The combination of claim 1 wherein said radiation detection station is positioned between said guide members.

5. The combination of claim 1 wherein said radiation source includes a plurality of spaced radiation conducting members and wherein each of said radiation sensitive means is associated to a different one of said radiation conducting members, paired ones of said radiation conducting members and said radiation sensitive means each defining one of a plurality of information channels corresponding to said preencoded tracks on said film strip.

6. The combination of claim 1 wherein said film strip is provided with sprocket holes and said drive means comprises a sprocket wheel having a plurality of teeth engagable with said sprocket holes on said film strip.

7. The combination of claim 1 wherein said tension maintaining means comprises an arm pivotally coupled to said support member, guide means carried by said arm and engagable with said film strip, and bias means for biasing said guide means against said film strip.

8. The combination of claim 1 wherein said film strip is encoded in accordance with a first digital encoding format, and wherein said optical encoder unit further includes display means, means for converting the output signals from said radiation detection station to signals having a second digital format, and means responsive to said second digital format signals for driving said display means in accordance therewith.

9. The combination of claim 8 wherein said first digital format comprises the Gray code and wherein said second digital format comprises the binary coded decimal code.

10. The combination of claim 1 further including means for transmitting said radiation detection station signals to a remote site.

11. In a system for measuring the level of a liquid in a reservoir, said system having translatable means for following variations in the level of said liquid and means rotated in response to movement of said translatable means, an optical encoder unit for generating digital electrical signals defining the level of said liquid, said optical encoder unit comprising:
 a support member;
 first and second film reels rotatably secured to said support member;
 motion translating means coupled to said reels for transferring motion therebetween;
 guide means secured to said support member;
 a radiation detection station mounted adjacent said guide means, said station including a radiation source for generating a plurality of spaced radiation beams and a radiation detector assembly having a plurality of radiation sensitive means each associated to a different one of said beams for generating said electrical signals;
 a pre-encoded film strip received by said reels and guided by said guide means past said detection station, said film strip having a plurality of laterally spaced, longitudinally extending coded tracks each arranged to occupy the radiation path between said source and a different one of said generating means;
 a nonslip film drive means engagable with said film strip and having an input shaft coupled to said rotated means; and
 means for maintaining tension in said film strip as said film strip is translated past said detection station from reel to reel in response to rotation of said film drive means.

12. The combination of claim 11 wherein said reels are each provided with a toothed member and said motion translating means comprises a flexible belt engaged with said toothed members.

13. The combination of claim 11 wherein said guide means comprises a pair of stationary guide members.

14. The combination of claim 11 wherein said radiation detection station is positioned between said guide members.

15. The combination of claim 11 wherein said radiation source includes a plurality of spaced radiation conducting members and wherein each of said radiation sensitive means associated to a different one of said radiation conducting members, paired ones of said radiation conducting meembers and said radiation sensitive means each defining one of a plurality of information channels corresponding to said preencoded tracks on said film strip.

16. The combination of claim 11 wherein said film strip is provided with sprocket holes and said drive means comprises a sprocket wheel having a plurality of teeth engagable with said sprocket holes on said film strip.

17. The combination of claim 11 wherein said tension maintaining means comprises an arm pivotally coupled to said support member, guide means carried by said arm and engagable with said film strip, and bias means for biasing said guide means against said film strip.

18. The combination of claim 11 wherein said film strip is encoded in accordance with a first digital encoding format, and wherein said optical encoder unit further includes display means, means for converting the output signals from said radiation detection station to signals having a second digital format, and means responsive to said second digital format signals for driving said display means in accordance therewith.

19. The combination of claim 18 wherein said first digital format comprises the Gray code and wherein said second digital format comprises the binary coded decimal code.

20. The combination of claim 11 further including means for transmitting said radiation detection station signals to a remote site.

* * * * *